United States Patent
Raghavan et al.

[11] Patent Number: 5,715,433
[45] Date of Patent: Feb. 3, 1998

[54] DYNAMIC SOFTWARE MODEL FOR EMULATING HARDWARE

[76] Inventors: Rajan Raghavan, 859 Laburnum Dr., Sunnyvale, Calif. 94086; Jonathan Warren Liu, 4010 Valerie Dr., Campbell, Calif. 95008; Timothy Thomas Rhodes, 3638 Julio Ave., San Jose, Calif. 95124; Kodamanchilli Vijay Anand, 3651 Buckley Ave. #702, Santa Clara, Calif. 95051-2627

[21] Appl. No.: 425,962

[22] Filed: Apr. 20, 1995

[51] Int. Cl.[6] ............................................. G06F 13/36
[52] U.S. Cl. .................. 395/500; 395/183.09; 395/183.19
[58] Field of Search .................... 395/183.09, 183.19, 395/500, 458, 476

[56] References Cited

U.S. PATENT DOCUMENTS

| | | | |
|---|---|---|---|
| 4,611,320 | 9/1986 | Southard | 370/13 |
| 4,813,011 | 3/1989 | Kulakowski et al. | 364/900 |
| 5,311,520 | 5/1994 | Raghavachari | 371/21.6 |
| 5,317,537 | 5/1994 | Shinagawa et al. | 365/189.04 |
| 5,533,204 | 7/1996 | Tipley | 345/288 |

*Primary Examiner*—Kevin J. Teska
*Assistant Examiner*—N. L. Dehlitsch-Moats
*Attorney, Agent, or Firm*—Philip Thomas Virga, Esq.

[57] ABSTRACT

A dynamic hardware emulation model (10) to be used with a hardware simulator for testing a user device (26) under test. A programming interface (12) controls a memory pool (14) and a command processor/bus manager (16) such that a command cycle is initiated to read and write data through a computer bus (24), to and from the user device (26). The programming interface (12) and the user device (26) can act in a master or slave mode. When the user device (26) is in slave mode, a slave memory (18) contains expected data for comparison purposes, and an arbiter (20) determines which device will have access to the computer bus (24).

6 Claims, 1 Drawing Sheet

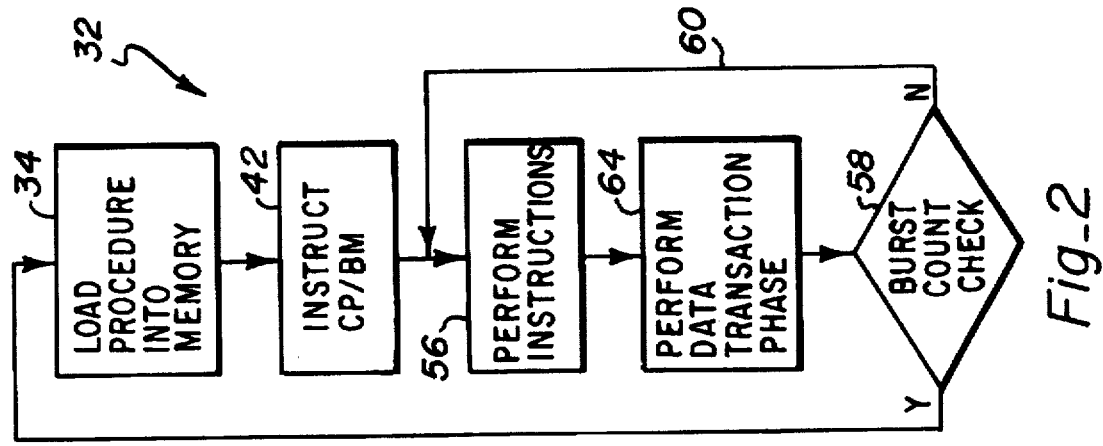
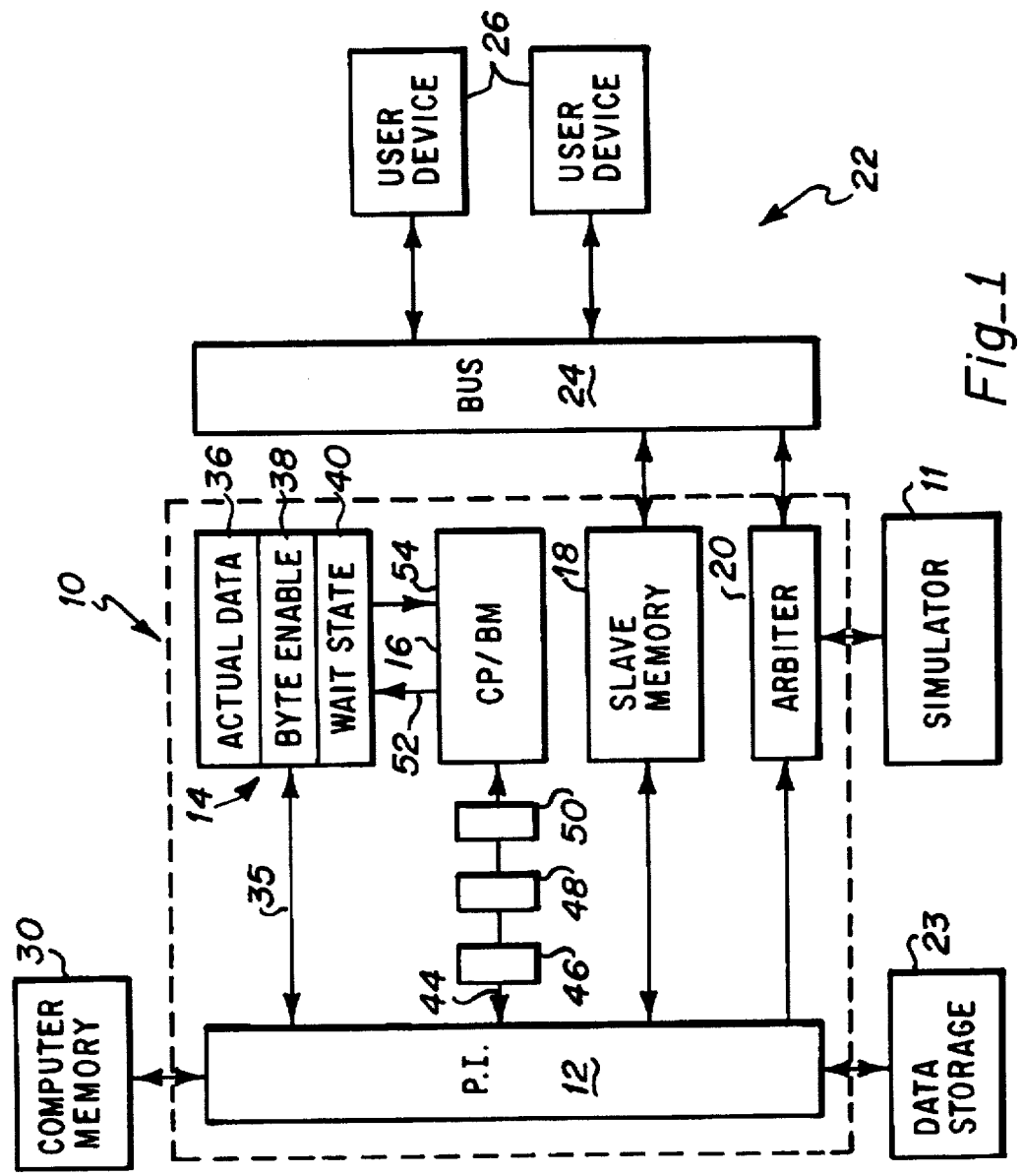
Fig_2
Fig_1

DYNAMIC SOFTWARE MODEL FOR EMULATING HARDWARE

TECHNICAL FIELD

The present invention relates generally to the field of computer hardware logic design, and more particularly to an improved simulation environment for developing and testing such hardware logic.

BACKGROUND ART

In designing and testing hardware interface logic for devices to be used with conventional bus computers, a primary task is to design hardware logic which will accomplish assigned tasks with optimal efficiency and as many desirable features as possible. For example, a video interface card intended for insertion into an industry standard Peripheral Component Interconnect ("PCI") bus computer would, ideally, quickly draw and refresh images on a video screen, with a maximum number of colors and other desirable features available. However, no matter how well designed such an interface is, it is of no value unless it communicates well with the computer's processor and other devices, as necessary, by means of the computer bus. Therefore, the makers of such hardware interfaces must give close attention to the design and testing of the interfaces for proper communication with the computer bus.

Several companies currently provide logic simulators, which are software tools which provide a means by which logic designers can emulate a working environment for hardware devices, such as the video interface card discussed above, so that the new hardware devices can be tested for proper operation in relation to the bus interface. Some of these vendors, as well as some other independent developers, provide "models" which plug into the software simulators. The models provide the necessary traffic on the bus to test new hardware interface devices. Such models are commonly written in one or both of two languages which are readily available and well known in the field: "VHDL™" (VERY HIGH SPEED INTEGRATED CIRCUIT HARDWARE DESCRIPTION LANGUAGE) or "Verilog™". Such models generally include a set of instructions for sending and receiving data to and from the device under test such as could be expected in a "real" application of the device, and further for storing the results of the data interchanges so that the results can be retrieved and studied at the end of the test.

Existing prior art models have performed quite effectively where there are few, or relatively few problems encountered during a test. However, as devices get even more complex, it becomes more important that models might, somehow, be able to become more interactive such that they are more of an aid in troubleshooting a complex interface problem rather than just a reporter of such problem. To the inventor's knowledge, prior to the present invention, no means has existed in the art for providing such dynamic interaction between the model, the simulator, and the device under test. All prior methods and means have generally just run preprogrammed tests and accumulated data to be studied at the end of the test.

DISCLOSURE OF INVENTION

Accordingly, it is an object of the present invention to provide a model which can react to eventualities occurring during a test.

It is still another object of the present invention to provide a model which can allow operator intervention during a test.

It is yet another object of the present invention to provide a model which can provide information about test results prior to the conclusion of the test.

It is still another object of the present invention to provide a model which can work in conjunction with commercially available simulators.

It is yet another object of the present invention to provide a model which is adaptable to be used with various bus types for testing various device types.

It is still another object of the present invention to provide a model which can be adapted for operator intervention or for programmed automatic test intervention upon the observance of predetermined test result criteria.

It is yet another object of the present invention to provide an improved means for troubleshooting new computer interface devices.

It is still another object of the present invention to provide a model that is appropriate for use by logic designers, system engineers, and VLSI chip designers.

Briefly, the preferred embodiment of the present invention is an improved model adapted for use with a PCI bus and having a programming interface controlling and directing a (primary) memory pool, a slave memory pool, a command processor/bus master and an arbiter, each of which is a software device affecting data traveling to and from a computer bus. A user device is connected to the computer bus such that, according to instructions issued from the programming interface, data is caused to travel between the bus and the user device, with verification occurring such that the nature of any failure can be readily determined and appropriate action taken (either by machine or user intervention). The unique structure of the dynamic hardware emulation model is dynamic, rather than operating in a batch mode as in the prior art, each portion of a test is individually informative and the test can be aborted, continued without interruption or automatically changed, as is appropriate to the nature of the user device and the specific test procedure being performed.

An advantage of the present invention is that users need not learn different modeling environments in order to test at different levels of design abstraction.

A further advantage of the present invention is that individual operations are separately verified such that a record is kept regarding errors and causes thereof, and further such that branching of a test can occur upon given error conditions.

Yet another advantage of the present invention is that test speed is optimized.

Still another advantage of the present invention is that development time is minimized because additional information is provided from testing, and further because futile testing is avoided.

These and other objects and advantages of the present invention will become clear to those skilled in the art in view of the description of the best presently known mode of carrying out the invention and the industrial applicability of the preferred embodiment as described herein and as illustrated in the several figures of the drawing.

BRIEF DESCRIPTION OF THE DRAWINGS

FIG. 1 is a block diagram of the inventive dynamic hardware emulation model; and FIG. 2 is a flow diagram of a cycle of operation of the dynamic hardware emulation model of FIG. 1.

BEST MODE FOR CARRYING OUT INVENTION

The best presently known mode for carrying out the invention is a dynamic hardware emulation model for use in conjunction with a computer hardware environment simulator. The predominant expected usage of the inventive dynamic hardware emulation model is in the design and testing of hardware component devices intended to be connected to the data bus of a computer.

The inventive dynamic hardware emulation model is depicted in a block conceptual diagram in the view of FIG. 1, and is depicted therein by the general reference character 10. One skilled in the art will recognize that a model such as the inventive dynamic hardware emulation model 10 is intended to be used in conjunction with a software test environment simulator 11, several versions of which are commercially available from Synposis™, Cadence™, and other sources. As can be seen in the view of FIG. 1, the dynamic hardware emulation model 10 has a programming interface ("PI") 12, a pool memory 14, a command processor/bus master ("CP/BM") 16, a slave memory 18, and an arbiter 20. The best presently known embodiment 10 of the present invention is a software component residing within a computer system 22 within a data storage device 23. A PCI bus 24 has attached thereto (in addition to several component models (for example an arbiter, clock generator, or the like) necessary and usual for the emulation of the bus environment which are not shown for the sake of clarity) at least one user device 26 (two user devices 26 are shown by way of example in the view of FIG. 1) which is under examination. The memory pool 14 and slave memory pool 18 resides in a conventional main memory 30 of the computer system 22, and will be discussed in more detail hereinafter.

FIG. 2 is a flow diagram of a test process 32 according to the best presently known embodiment 10 of the present invention. In the example of FIG. 2 it is understood that the PI 12 has therein a series of instructions for performing a particular test or test sequence. Such instructions can optionally be placed in the PI 12 itself or retrieved from files stored in the data storage device 23 or through user intervention from the data storage device 23 and, optionally, also by individual user input (as from a keyboard or other input device, not shown). In a load procedure into pool memory operation 34 a series of data for distinct operations is loaded into the pool memory 14 (FIG. 1) by means of a pool memory PI access port 35 (FIG. 1). The data stored by the load procedure into memory operation 34 will have actual data 36, byte enable 38 instructions and wait state data 40, such that a wait state and byte enable can be specified for each step of the operation.

In an instruct CP/BM operation 42 (shown, by way of example as following the load procedure into pool memory operation 34 in the view of FIG. 2, although the load procedure into pool memory operation 34 and the instruct CP/BM operation generally occur relatively simultaneously and may, in fact, be interspersed), instructions appropriate to the current operation are provided from the PI 12 to the CP/BM 16 via a CP/BM command link 44. As an example, where the user device 26 under test is a video graphics array ("VA") video interface card, an operation might be to write data beginning at a particular memory address, and a series of operations might be to continue to write data into the VA card, beginning at a particular address. The data to be written (the actual data 36) would be supplied to the pool memory 14, and a burst count 46, address 48 and command 50 are provided from the PI 12 to the CP/BM 16. (The burst count 46, address 48 and command 50 are illustrated graphically in the view of FIG. 1 as blocks of data on the CP/BM command link 44.) In addition to the pool memory PI access port 35, the pool memory also has a CP/BM write port 52 and a CP/BM read port 54, both to enable direct communication between the CP/BM 16 and the pool memory 14.

It is known in the industry that certain commands are associated with certain bus types. For example standard commands for the PCI bus 24 are memory read, memory write, configuration read, configuration write, input/output ("I/O") read and I/O write. The inventive dynamic hardware emulation model provides a modified set of commands such that each of the commands can add an optional verify. That is, instead of just "memory read" a command can be "memory read and verify" and a "memory write" can be "memory write and verify". A "read modify write" command is also enabled in the best presently known embodiment 10 of the present invention. It is known in the industry, for example where it is desired to superimpose one image over another on a video screen, to read data (as from the user device 26 where the user device 26 is a video interface card), and to modify such data according to a complex parameter such that a composite of the "old" image (the one already showing on the screen) and a new image.

The user device 26 can operate in a master or slave mode. That is, the user device 26 can be commanded, as by the PI 12, to send or receive data, or the user device 26 can itself, acting as the master, issue commands.

The slave memory 18 contains data which is read from a user device 26 when the user device 26 is in the slave mode. The arbiter 20 determines which of the user devices 26 (or other device) has access to the bus 24, should more than one such device request access to the bus simultaneously.

Returning to the flow diagram of FIG. 2, in a perform instructions operation 56, the CP/BM 16 performs an operation as previously instructed by the PI 12, using data put into the pool memory 14 by the PI 12, and advances a burst counter. A perform data transaction phase 64 shows in FIG. 2 indicates the accomplishment of any data input or output required according to the instructions performed in the perform instructions 56 operation. In a burst count check decision operation 58, if the burst counter matches the burst count 46 (FIG. 1) previously loaded into the CP/BM then the burst counter is reset and control is returned to the PI to begin the next test process 32. If the burst counter does not match the burst count 46, then the burst counter is advanced and the next perform instructions 56 operation is initiated, as is shown in the view of FIG. 2 by a cycle return loop 60 indication. Each repetition of the perform instructions operation is referred to as a cycle. It should be noted that instructions issued from the PI 12 can also be "non-burst" instructions wherein a single operation rather than a series of operations is performed.

Various modifications may be made to the invention without altering its value or scope. For example, while the example of the best presently known embodiment 10 of the present invention relates to a PCI bus, the invention is adaptable for use with any such bus or similar computer hardware interconnection means. Similarly, while the best presently known 10 embodiment is written in and intended for operation with the VHDL™ language, as discussed previously herein, it is intended by the inventors Verilog™ or other language versions of the invention be produced. Furthermore, while the user device 26 is generally illustrated herein as being a video interface card, application of the present inventive dynamic hardware emulation model 10 is by no means restricted to the development and testing of video interface cards.

All of the above are only some of the examples of available embodiments of the present invention. Those skilled in the art will readily observe that numerous other modifications and alterations may be made without departing from the spirit and scope of the invention. Accordingly, the above disclosure is not intended as limiting and the appended claims are to be interpreted as encompassing the entire scope of the invention.

INDUSTRIAL APPLICABILITY

The inventive dynamic hardware emulation model 10 is intended to be widely used, in conjunction with commercially available simulators, in the design and testing of computer interface device, such as video interface cards, that are to be inserted into the bus slots of computers.

As contrasted to existing prior an models, wherein a test had to be loaded and run in its entirety (excepting, perhaps, where a catastrophic failure might 'hang up' a system and thereby self abort a test), the inventive dynamic hardware emulation model 10 can be programmed to carry out actions based on responses from the user device 26 under test, thereby both avoiding the continuation of a fruitless test and allowing the branching of a test to a useful line of inquiry, should there be a failure. Such branching can occur simply by stopping the test and allowing the human user to decide how to then proceed, or else a more sophisticated routine might allow for the automatic branching of tests upon certain potential failure modes.

Further as contrasted to existing prior art models, wherein accumulated data had to be processed and investigated at the end of a test, the present inventive configuration allows for an operation by operation verification of test results, thus not only preventing fruitless testing, as discussed above, but also providing additional valuable information to the hardware designers. That is, as contrasted to prior art modules wherein a user would only know that an error had occurred—that data had not been transmitted or received as expected—(and then only after time consuming evaluation of accumulated data), users of the inventive dynamic hardware emulation model 10 will know the nature of the error.

The inventive dynamic hardware emulation model 10 will be readily recognized and accepted by those who use such models. The additional features, as compared to prior art models, will be easily understood. The user may not even understand or need to know that such additional features are not simply additions to prior art models, but rather required a complete rethinking of how such models are arranged, as discussed herein, in order to implement the new and useful features.

It is anticipated that, as the present invention is further developed, more sophisticated test routines and parameters will be developed both by the inventors and by other users of the dynamic hardware emulation model 10. Indeed, it is an important aspect of the present invention that the pool memory 14, the command processor/bus master 16 and the slave memory 18 are implemented and interconnected generally as presented in relation to the best presently known embodiment 10 of the present invention, thereby allowing ready access between the various component parts of the invention and providing a platform upon which further ingenuity can be built. As discussed previously herein, the inventors have provided such a flexible platform as an alternative to the prior art paradigm for a model, wherein there was no built opportunity to conform the sequence of a test according to individual need.

Each user may elect to interact with the dynamic hardware emulation model 10 in varying degrees of detail. The user may specify PCI bus commands directly, or call upon a macro command which provide the composite commands such as "read modify write" and "read verify". The 'on the fly' read verify described herein, which verifies each read transaction, eliminates the need for time consuming comparison of accumulated data to a file of expected data. This leads to higher productivity and design accuracy, when developing computer interface devices, by preventing spurious testing. Since the user interface of the dynamic hardware emulation model 10 remains constant no matter what level of detail is required in the testing, user learning time is minimized.

The VHDL implementation of the best presently known embodiment 10 of the present invention will run on any commercially available IEEE-1076 compliant VHDL simulator, although versions which will run on other simulators and hardware accelerator versions are anticipated by the inventors. The present inventive dynamic hardware emulation model 10 is intended to be used as a substitute for existing models and can be substituted therefor without substantial modification of associated hardware and software, and without substantial effort or learning on the part of users. Since the dynamic hardware emulation model 10 of the present invention may be readily produced and integrated into existing development and testing environments, it is expected that it will be readily accepted in the industry. For these and other reasons, it is expected that the utility and industrial applicability of the invention will be both significant in scope and long-lasting in duration.

APPENDICES TO

U.S. APPLICATION ENTITLED:

DYNAMIC HARDWARE EMULATION MODEL

DOCKET NO. 73497-0001

RAGHAVAN ET AL.

FILED APRIL 20, 1995

```
--------------------------------------------------------------------
--
--    COPYRIGHT (C) 1994 BY RAVIcad, Inc.
--    ALL RIGHTS RESERVED
--    PROPRIETARY AND TRADE SECRET
--    USAGE AND DISCLOSURE AS PER LICENSE AGREEMENT.
--
--------------------------------------------------------------------
--------------------------------------------------------------------
--
-- File name   : tstarter.vhd
-- Version Num : 2.0
-- Date        : Oct 27th 1994
-- Author      : TTR
-- Description : An example test bench, for the user to get familiar
--               with the model.
--               Following are demonstrated in this file:
--                 *  Ease of programming the model.
--                 *  Flexibility of debugging using the model.
--                 *  Use of high-performance commands of the model.
--                 *  Extensive on-line documentation.
--
--------------------------------------------------------------------

--
-- For purposes of simplicity, the first type of PI programming will
-- focus on the two memory pools, Master and Slave.  It is not necessary
-- for a functional PCI bus be present in order to exercise
-- these parts of the AccelPCI system model.  In the following
-- example, data is written to the master pool then read back, followed
-- by the direct PI interface to the slave pool.
--
-- Note: these first examples do not involve the PCI bus directly, but are used
-- as illustration of the style of programming used in this
-- sample code. It is assumed that the programmer has a basic understanding
-- of the AccelPCI architecture.  If more information is desired,
-- please refer to the "AccelPCI Users Handbook".
--
-- The PI and the various components of the AccelPCI model communicate
-- through a number of procedures defined in the packages at the
-- top of this file. For more specific information about the interface
-- procedures, please refer to the "AccelPCI VHDL Model" document from RAVIcad.
-- Of special interest here are three sets of procedures:
--
-- mpSetSignal() and spSetSignal() : these two procedures apply their
--       arguments to the master and slave pool interface signals but do
--       not trigger any action by the AccelPCI model.
--
-- mpCycle() and spCycle() : these two procedures apply their commands
--       signal values as required by the operation specified and the
--       parameters passed.  In addition, these also trigger execution
--       of the specified operation.
--
-- wait4mpdone and wait4spdone : these two procedures suspend the user
--       test bench until the command specified to either the MP or SP has been
--       completed. Again, recall that the architecture of the AccelPCI
--       model does not require the user test bench to participate
--       in a clock-by-clock basis with the PCI system under test.
--
```

```
-- MAIN POOL WRITE
--
-- The first loop writes 32 words into the master pool memory, the second reads
-- it back for comparison.
--

ASSERT (FALSE)
    REPORT "Loading Main memory Pool with 32 data words."
    SEVERITY NOTE;

for i in 0 to 16#F# loop be := (others => '0');
        be(i mod 4) := '1';
        mpSetSignal(mpsig, SET_BE, be);
        mpSetSignal(mpsig, SET_WS, i mod 8);
        mpSetSignal(mpsig, SET_DATA, 16#1010101# * i);
        mpCycle(mpsig, WRITE_ALL, 16#100# + i);
        wait4mpdone;

end loop;

--
-- MAIN POOL READ
--
-- Read the data back again and compare it to the original.
--

ASSERT (FALSE)
    REPORT "Reading Main memory Pool with 32 data words."
    SEVERITY NOTE;

for i in 0 to 16#F# loop exp_data         := CONV_STD_LOGIC_VECTOR(16#1010101# * i, C_DT_WD);
        exp_be           := (others => '0');
        exp_be(i mod 4)  := '1';
        exp_ws           := CONV_STD_LOGIC_VECTOR(i mod 8, C_WS_WD);

mpCycle(mpsig, READ_ALL, 16#100# + i);
        wait4mpdone;

ASSERT (mpsig.POOL_DATA_DO = exp_data)
        REPORT "Pool data memory readback miscompare."
        SEVERITY FAILURE;

ASSERT (mpsig.POOL_WS_DO = exp_ws)
        REPORT "Pool wait state memory readback miscompare."
        SEVERITY FAILURE;

end loop;
```

```
--------------------------------------------------------------------
--
--      COPYRIGHT (C) 1994 BY RAVIcad, Inc.
--      ALL RIGHTS RESERVED
--      PROPRIETARY AND TRADE SECRET
--      USAGE AND DISCLOSURE AS PER LICENSE AGREEMENT.
--
--------------------------------------------------------------------
--------------------------------------------------------------------

-- File name    : cp_bm_ctl.vhd
-- Title        : COMMAND PROCESSOR / BUS MASTER CONTROL
-- Version      : Behavioral to incorporate timing through generics.
-- Version Num  : 2.1
-- Date         : Nov 7th 1994

--------------------------------------------------------------------
--
-- This is just a portion of the CP_BM_CTL.VHD which demonstrates the
-- genration of the pool memory write enable (PB_WE_N) for PORT B and
-- address/data being fed to the PORT B (PB_DI)
--
--

PC_A  <= pool_rp;   -- pool read pointer
PB_A  <= pool_wp;   -- pool write pointer --
-- Write the pool memory during reads from the bus, in burst mode only!
--
PB_WE_N <= cben_out when (xfer_pulse = '1' and not pci_write and not single_xfer
                   else (others => '1');

PB_DI <= AD;

-- Registers synchronous to free running clock, with asynchronous preset/clear.
FREE_RESET_REGS:
process (RST_N, FREECLK)

begin     -- FREE_RESET_REGS if (RST_N = '0') then
        done      <= '0';
        first_wd  <= FALSE;
        pool_rp   <= (others => '0');
        pool_wp   <= (others => '0');
```

```
--------------------------------------------------------------------
--
--      COPYRIGHT (C) 1994 BY Ravicad, Inc.
--      ALL RIGHTS RESERVED
--      PROPRIETARY AND TRADE SECRET
--      USAGE AND DISCLOSURE AS PER LICENSE AGREEMENT.
--
--------------------------------------------------------------------
--
-- File name    : pool_ctl.vhd
-- Version Num  : 2.1
-- Date         : Nov 7th 1994
-- Title        : POOL MEMORY CONTROLLER
-- Purpose      : To emulate the behavior of a triple port pool memory
--                using only a single port RAM model.  This is done
--                by multiplexing the address, data-in, and write
--                control signals from the 3 ports.
--                This module is fully synthesizable.
--
--------------------------------------------------------------------

--
-- This process forms the write pulses for all of the data, wait state,
-- and byte enable memories.
--
WRITE_PULSER:
process (PI_POOLENA, PB_WE_N, pa_cyc_vld, PA_DATA_RW_N, PA_WS_RW_N,
PA_BE_RW_N, RWCLK)

variable data_write_n : std_logic_vector(DATA_WE_N'range);
variable ws_write_n   : std_ulogic;
variable be_write_n   : std_ulogic;

begin
        -- Default is no write.
        data_write_n := (others => '1');
        ws_write_n   := '1';
        be_write_n   := '1';

--
        -- The CPBM directly provides the write enables when it is processing
        -- a PCI transaction, otherwise they depend on what the PI is doing.
        --
        if (PI_POOLENA = '0') then
                data_write_n := PB_WE_N;

else
                --
                -- Write the data from the PI only when the CPBM is not busy
                -- with a PCI transaction and the PI has requested a write cycle
                -- Also write the wait states and byte enables if the PI so requ
                --
                if (pa_cyc_vld = '1') then
                        if (PA_DATA_RW_N = '0') then
                                data_write_n := (others => '0');
                        end if;
                        ws_write_n := PA_WS_RW_N;
                        be_write_n := PA_BE_RW_N;
```

```
        end if;
end if;

--
-- The write pulses are formed by OR-ing (logically AND-ing) the active
-- write enable signals with an inverted version of the read-write clock
--
for i in DATA_WE_N'range loop
        DATA_WE_N(i) <= data_write_n(i) or not RWCLK;
end loop;
WS_WE_N <= ws_write_n or not RWCLK;
BE_WE_N <= be_write_n or not RWCLK;

end process WRITE_PULSER;
```

```
---------------------------------------------------------------------
--
--      COPYRIGHT (C) 1993 BY RAVIcad, Inc.
--      ALL RIGHTS RESERVED
--      PROPRIETARY AND TRADE SECRET
--      USAGE AND DISCLOSURE AS PER LICENSE AGREEMENT.
--
---------------------------------------------------------------------
---------------------------------------------------------------------
--
-- File name    : pipkg.vhd
-- Version Num  : 2.1
-- Date         : Nov 7th 1994
-- Title        : PCI Model's Programming Interface
-- Purpose      : The purpose of this package is to define and describe
--                procedures providing the Programming Interface.
--
---------------------------------------------------------------------

--
    --  The following two 'mpCycle procedures are for Writing one of the values
    --  in the Pool Memory. It could be DATA, WS or BE.
    --  Overloaded to pass integer or st_logic_vector address, and param to be wr
    -- procedure mpCycle (
        signal      pi2mp_signal  :  inout pi2mp_rec;
        constant    operation     :  in MP_OPTYPE;
                    mp_addr       :  in std_logic_vector;
                    mp_param      :  in std_logic_vector
    ) is variable valid_operation : boolean := TRUE;

begin case operation is when WRITE_DATA  =>
                    pi2mp_signal.pool_data_di       <= mp_param;
                    pi2mp_signal.pool_data_rw_n     <= '0';
                    pi2mp_signal.pool_ws_rw_n       <= '1';
                    pi2mp_signal.pool_be_rw_n       <= '1';

when WRITE_WS    =>
                    pi2mp_signal.pool_ws_di         <= mp_param;
                    pi2mp_signal.pool_data_rw_n     <= '1';
                    pi2mp_signal.pool_ws_rw_n       <= '0';
                    pi2mp_signal.pool_be_rw_n       <= '1';

when WRITE_BE    =>
                    pi2mp_signal.pool_be_di         <= mp_param;
                    pi2mp_signal.pool_data_rw_n     <= '1';
                    pi2mp_signal.pool_ws_rw_n       <= '1';
                    pi2mp_signal.pool_be_rw_n       <= '0';

when OTHERS =>
                    valid_operation := FALSE;
```

```
    end case;

if valid_operation then
       pi2mp_signal.pool_addr <= mp_addr;
       pi2mp_signal.pool_go <= not pi2mp_signal.pool_go;
    end if;

ASSERT valid_operation
       REPORT "mpCycle(): operation not valid !!"
       SEVERITY WARNING;

end;
```

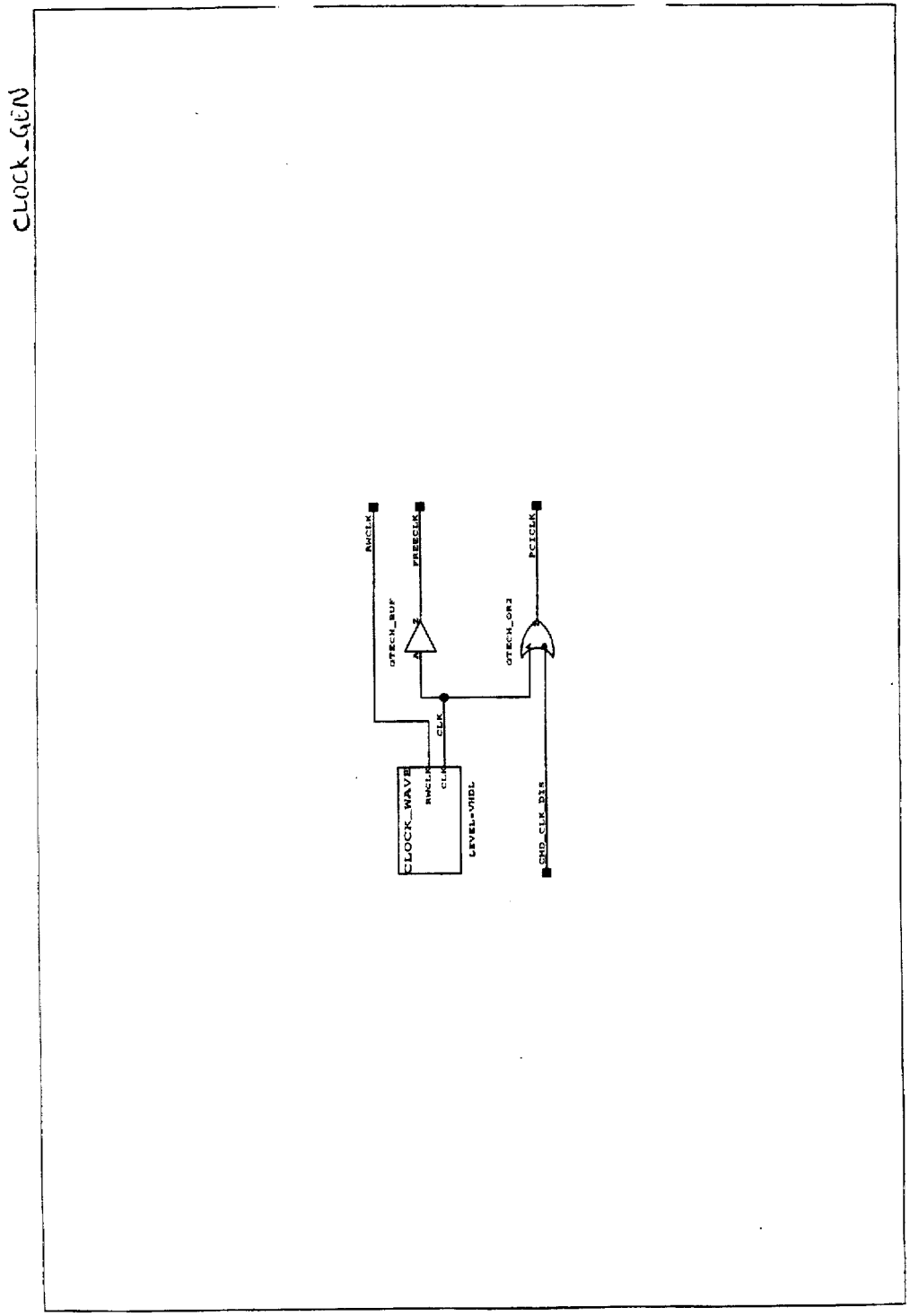

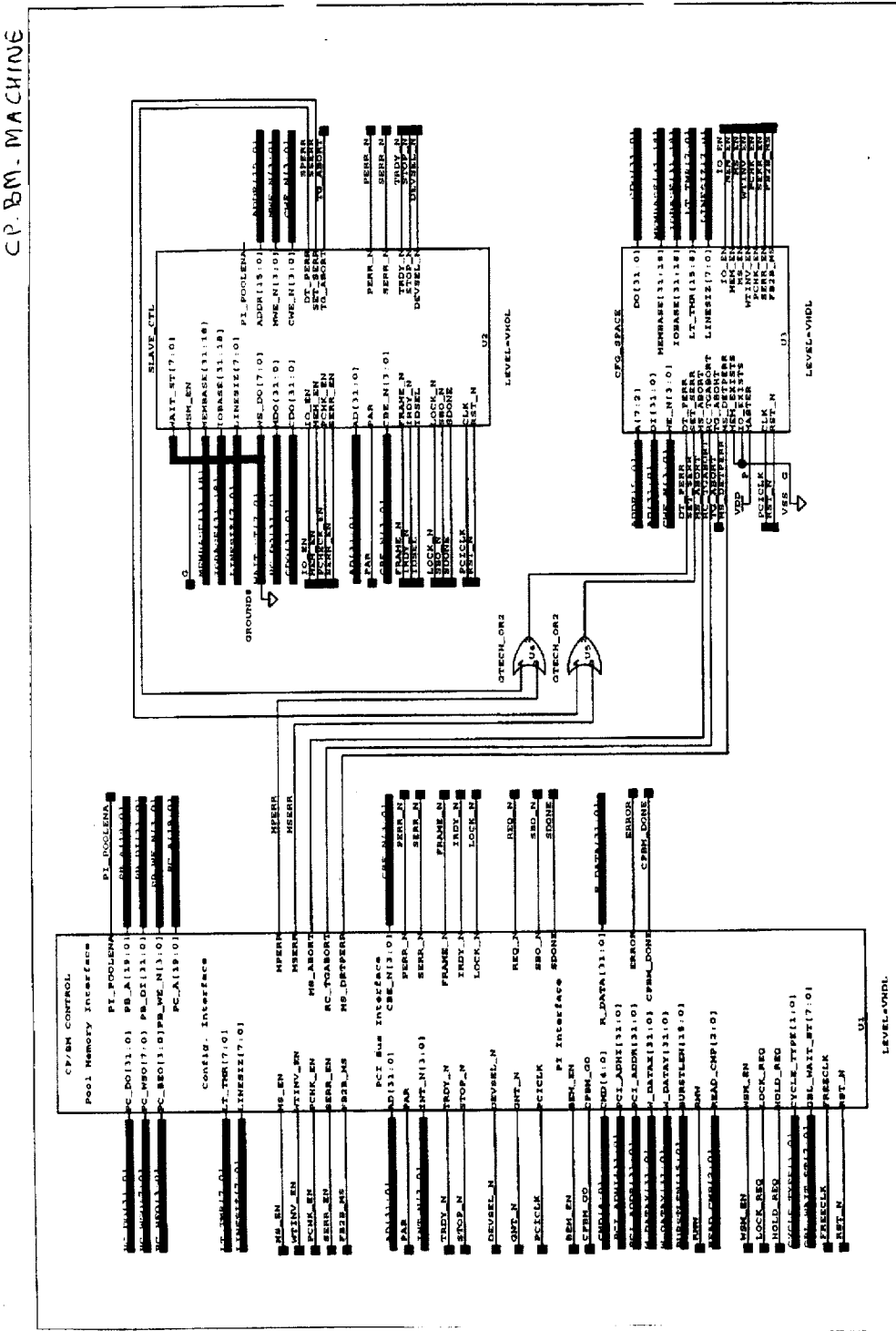

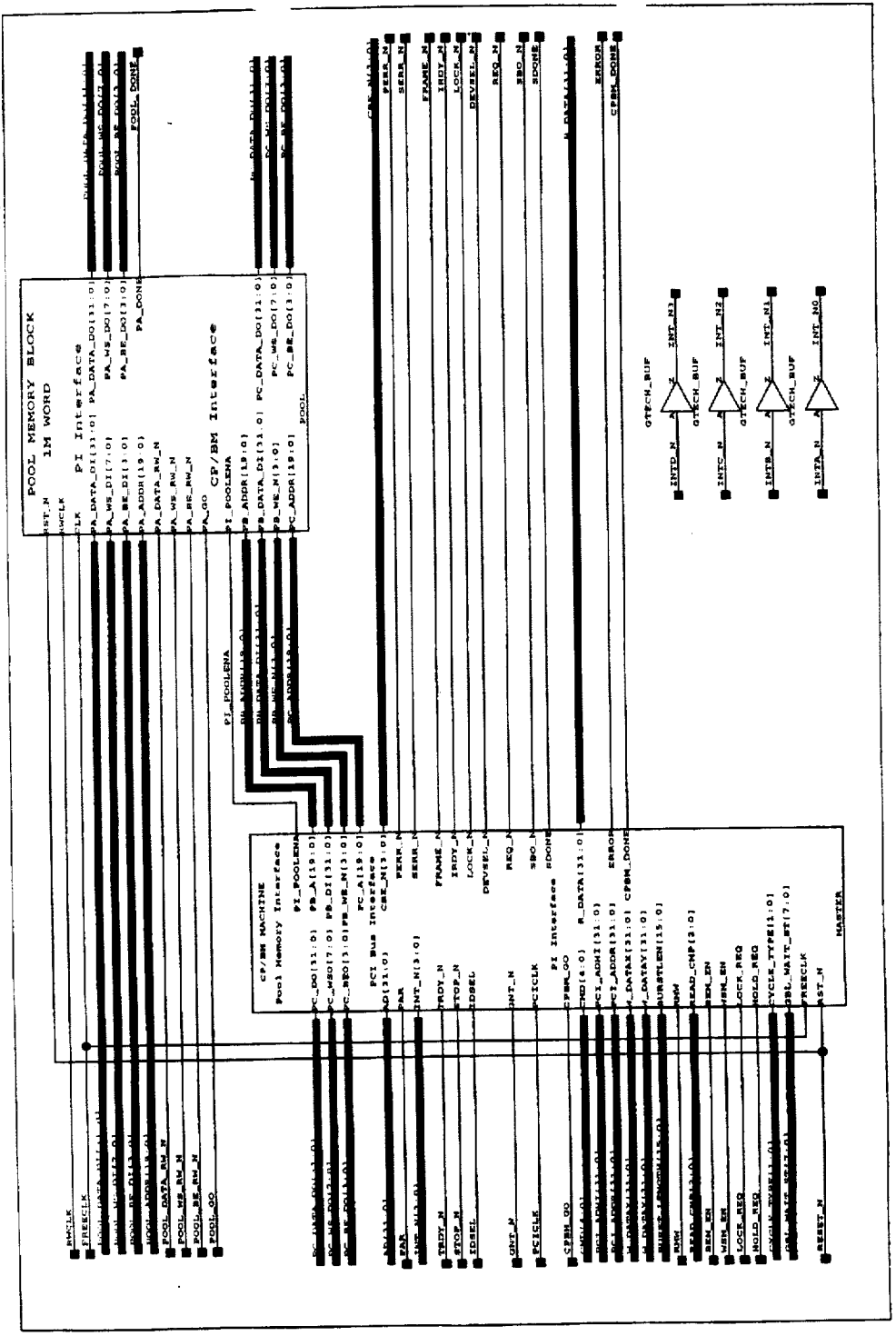

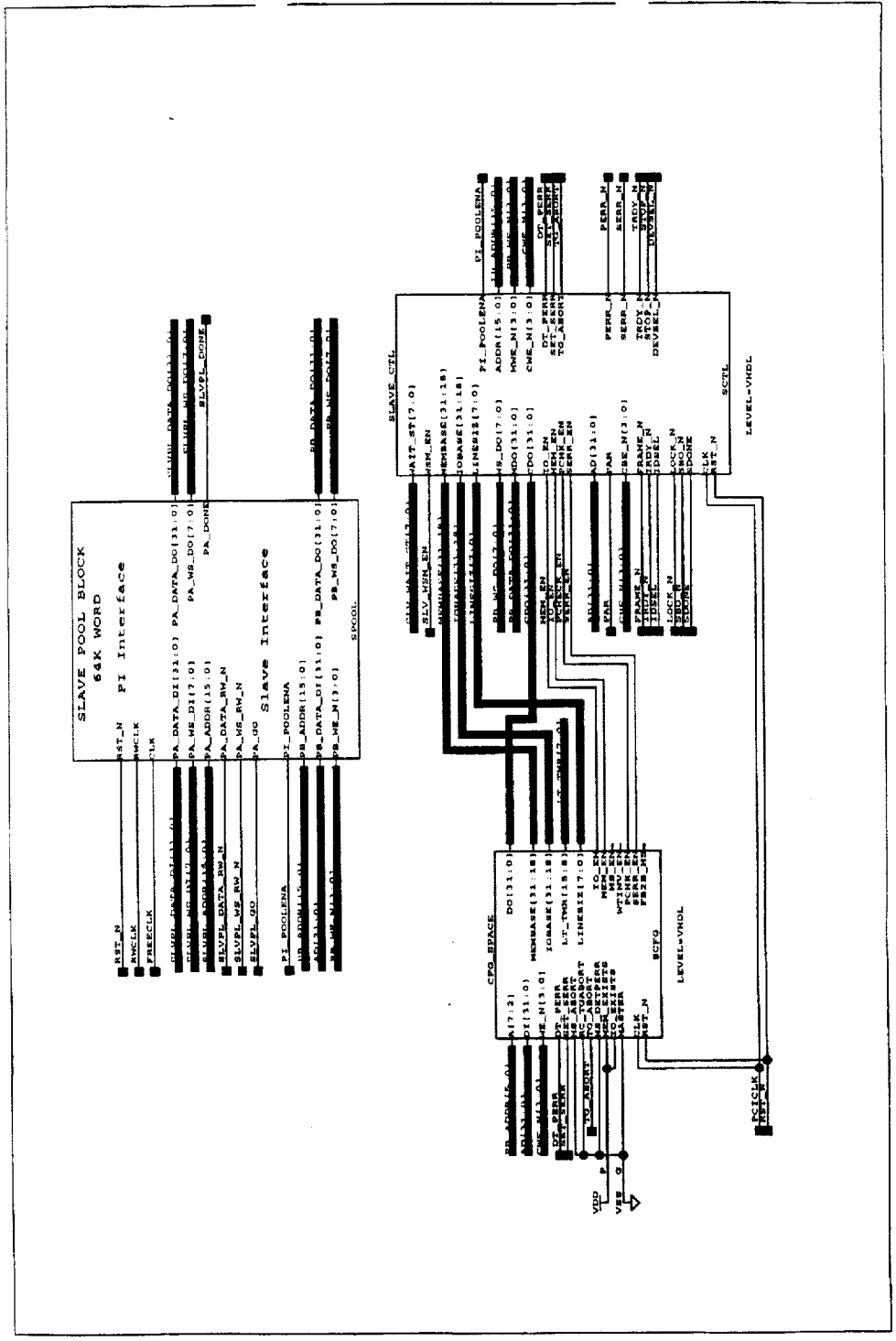

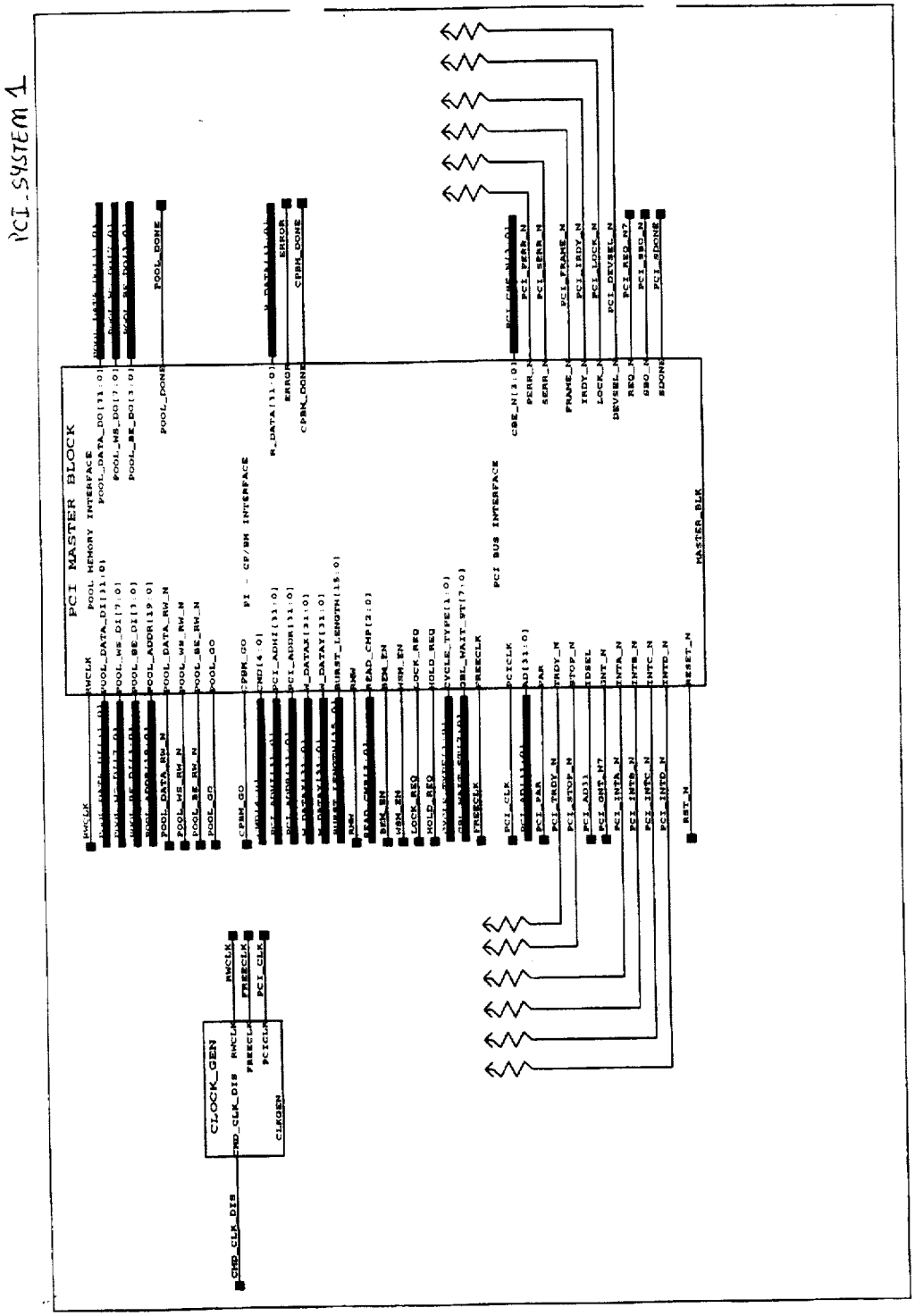

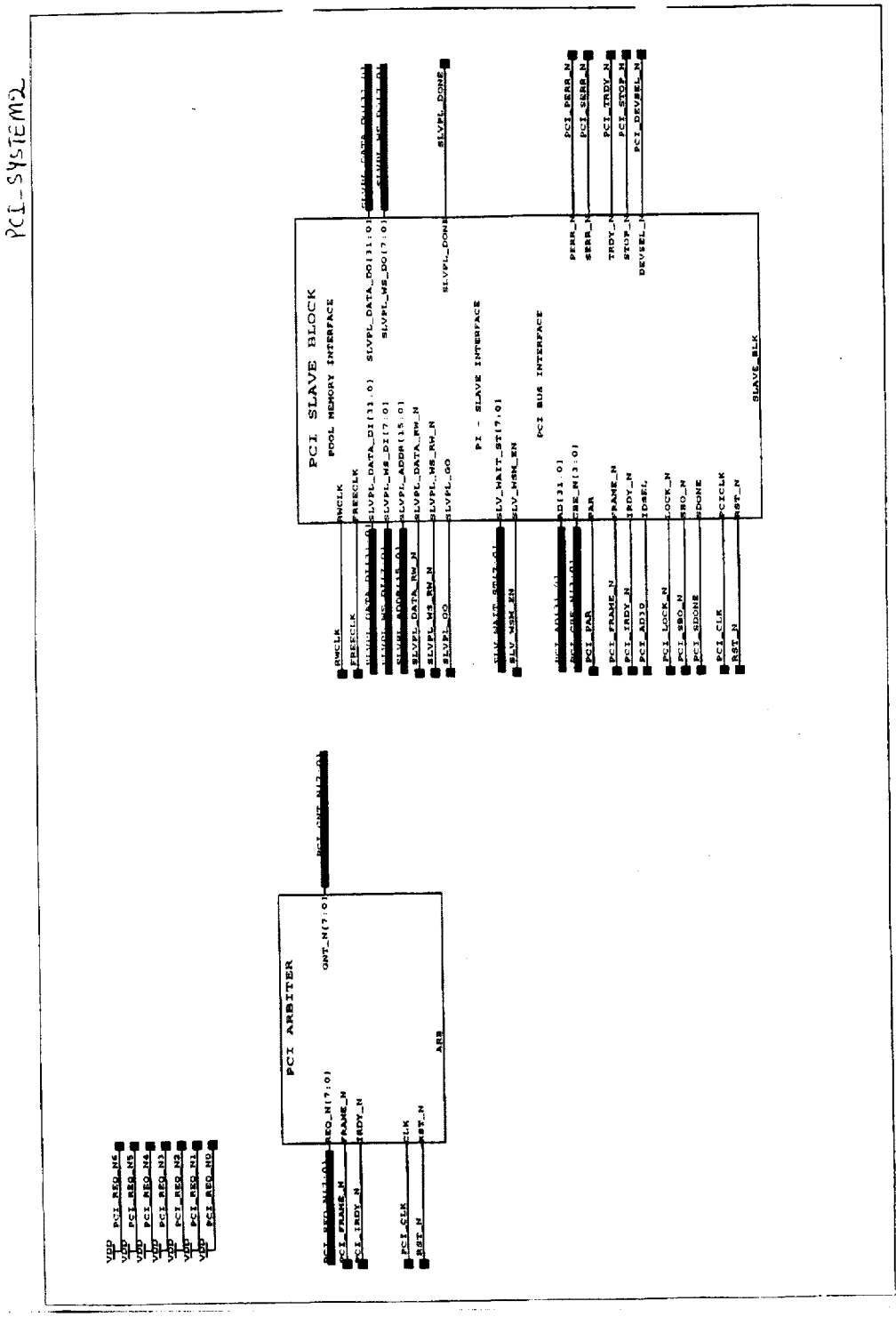

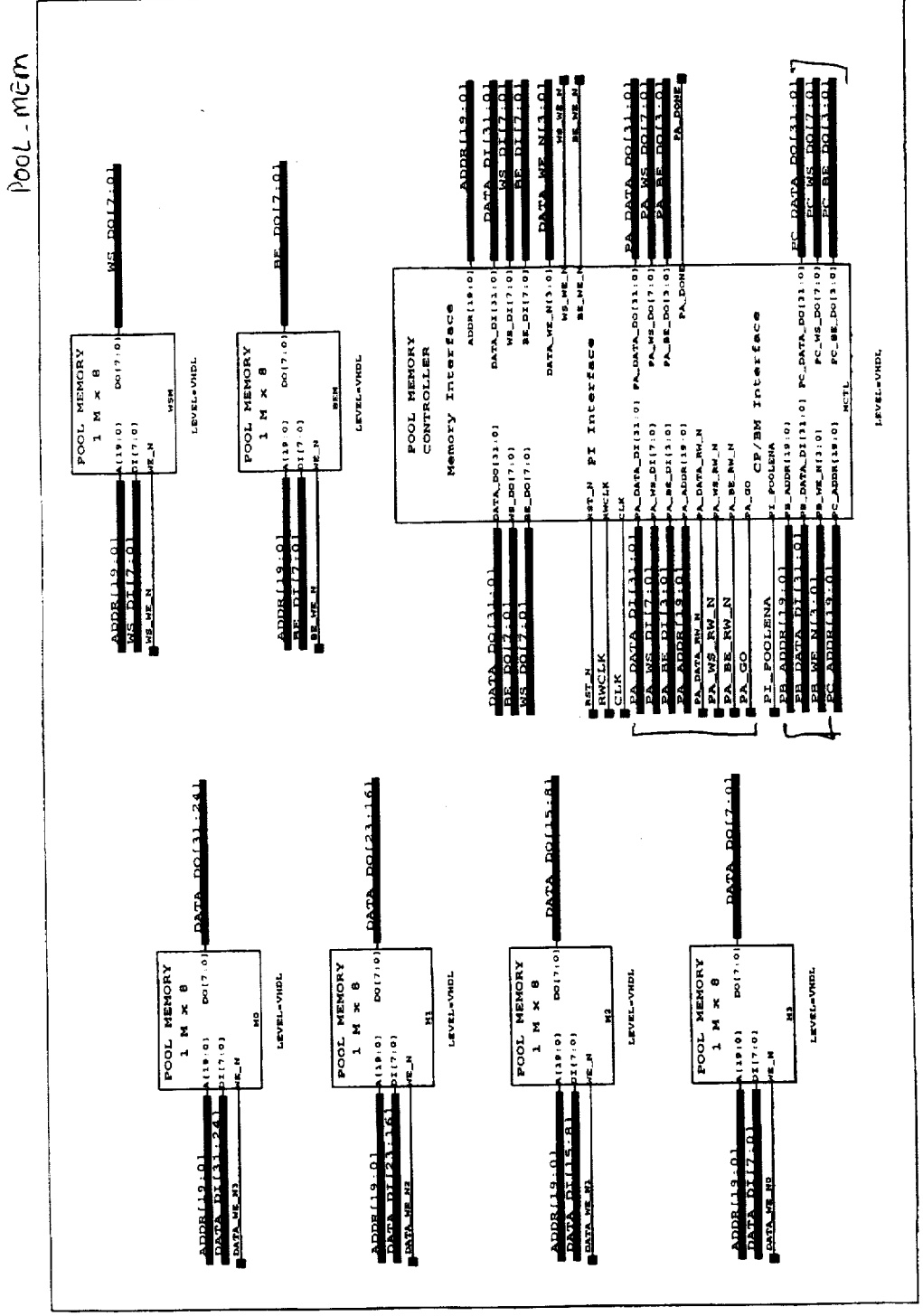

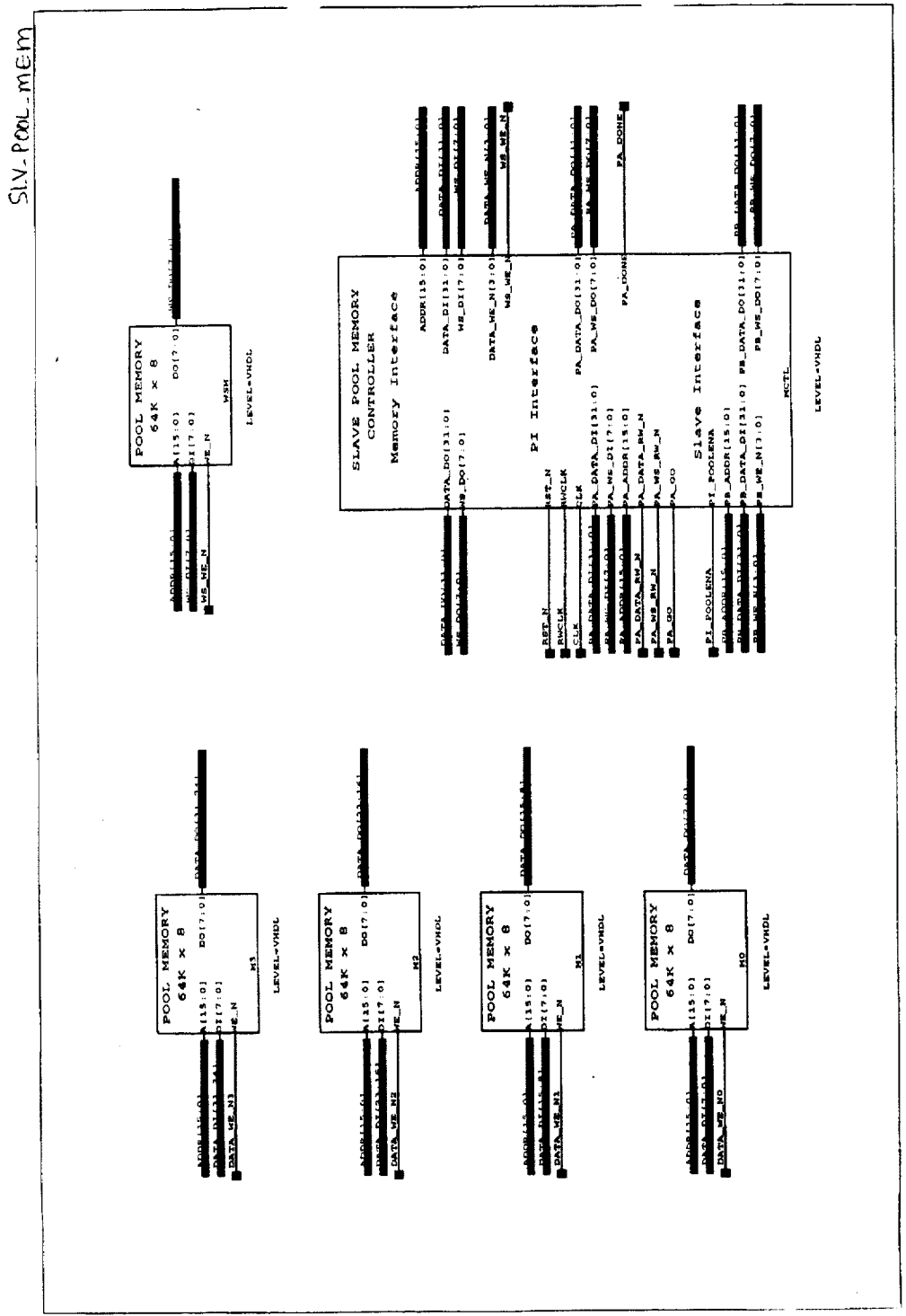

Contents

|  | Page Number |
|---|---|
| PCI Bussim Model Architecture | |
| | |
| 1. PCI Bussim: Pool Memory Organization | 2 |
| Slave Pool (SP) | 2 |
| Master Pool (MP) | 2 |
| | |
| 2. PCI Bussim: Programmable Registers | 3 |
| POOL_RP — Pool Read Pointer | 3 |
| POOL_WP — Pool Write Pointer | 3 |
| SCRATCH — CP/BM Scratch register | 3 |
| ERRSTAT — CP/BM Error Status register | 3 |
| CPBM_TO — Time out register for CP/BM | 4 |
| CMP_LOOPCT — Count of interations for a loop compare | 4 |
| CMP_WAITCT — Wait count between iterations of loop compare | 5 |
| AD_STEPCT — Address Step count register | 5 |
| Command Codes | 5 |
| | |
| 3. PCI Bussim: Programming Interface | 6 |
| Introduction | 6 |
| PI to Memory Pool Interface record type | 6 |
| Master Pool Interface signals | 7 |
| Slave Pool Interface signals | 7 |
| PI to CP/BM Interface record type | 8 |
| Interface Procedures | 9 |
| Master Pool Memory Interface procedures | 9 |
| *mpSetSignal()* | 9 |
| *mpCycle()* | 10 |
| Slave Pool Memory Interface procedures | 11 |
| *spSetSignal()* | 11 |
| *spCycle()* | 11 |
| CP/BM Interface procedures | 12 |
| *cpSetGlobal()* | 12 |
| *cpPciCycle()* | 14 |

PCI Bussim: Pool Memory Organization

There are two blocks of pool memories used by the Master (Command Processor/Bus Master - CP/BM) and Slave blocks. The pools are named Master Pool (MP) and Slave Pool (SP) depending on the block using the pool. The Pool Memory is used during a burst cycle, where individual data, wait states and byte enables are stored for each transfer of the burst. The interface to each of the Pool Memories is provided through individual set of signals connected to them, and through VHDL procedures provided by the PI. Refer to the Programming Interface (PI) documentation for details. The transaction on the Pool Memory as seen by the PI is through the GO-DONE handshake mechanism. An event on the GO signal triggers the transaction, and an event on the DONE signal indicates a completion of the transaction.

*Slave Pool (SP)*
Each of the Slave Pool (SP) location can be accessed through the SLVPL_ADDR bus, from the PI. This value is decoded to point to a location in the SP, that is mapped to the Slave device address offset from the Base Address. For example, if the base address of the device is 0x20000000, then an address location of 0x2000001C would correspond to location 0x1C in the Slave device and hence the SP. Each location in the SP is organized as two fields - DATA and WS corresponding to data and wait states. The data field refers to the contents of the slave device address space, and the wait states are used by the slave device when responding to a PCI cycle, at that particular address. This WS field gives the number of clocks that the slave waits, and hence delaying the TRDY_N signal assertion on either a read or write transaction. A read or write operation at any location in the Pool Memory is determined by the RW_N location when the GO signal is triggered (by creating an event on it).

Each location in the SP can be accessed through the SLVPL_ADDR, a 16-bit address field. At each location, either the data, the wait state or both of the fields can be accessed for read or write by enabling the RW_N signal for the respective field.

*Master Pool (MP)*
The Master Pool (MP) can be accessed through the POOL_ADDR bus, from the PI. This address space is to provide parameters for the PCI cycles that the master initiates on the PCI bus. Each location in the MP is organized into three fields - DATA, WS and BE corresponding to data, wait states and byte enables respectively. There are RW_N signals for individual fields to enable the Read or Write mode to that field. The PI is used to write the parameters for the PCI cycles (that the CP/BM initiates) into the MP. Refer to the Programming Interface documentation for details on the procedures to access the MP.

The CP/BM accesses the Memory Pool MP through two registers - *Pool Read Pointer* and *Pool Write Pointer*. The Read Pointer is used to read the contents of the MP during a PCI cycle. For example, it reads the data field to get the *data* for a PCI write cycle. The Read Pointer also accesses the MP to get the *wait states* or *byte enables* for a PCI cycle when enabled. The Write Pointer is similarly used to write into the MP. This is usually during a PCI read cycle, when the data read from the PCI bus is written into the MP.

PCI Bussim: Programmable Registers

The Command Processor / Bus Master (CP/BM) is a complex state machine that handles composite commands to initiate cycles on the PCI bus with lot of programmability. There are internal registers that can be programmed to control some of the parameters. Others can be read to monitor the status of certain events on the PCI bus. The registers are accessed through the PCI_LOC_WRITE and PCI_LOC_READ commands on the CP/BM. The address of the register is placed on the PCI_ADDR when the above mentioned two commands are used. If a value needs to be written into any of the registers, the value is put on the W_DATAX bus.

The various registers that are available, and their use is described below.

POOL_RP
Address value is 0x0, provided as a constant C_POOL_RP in the *pidef* package. This register is a 32-bit read/write register. This is the Pool Read Pointer, which points to the location in the MP that the CP/BM accesses for reading the required fields from the MP. This is usually used for reading the data, that is to be written in a PCI write cycle, the wait states or the bytes enables required to be used during a PCI burst cycle when the respective enable bits are asserted. The contents of the register get incremented after the completion of each PCI cycle ending at a long-word boundary.

POOL_WP
Address value is 0x4, provided as a constant C_POOL_WP in the *pidef* package. This register is a 32-bit read/write register. This is the Pool Write Pointer, which points to the location in the MP where certain data obtained as a result of a PCI cycle is written. Whenever a PCI read cycle is executed, the data that is read, is written (stored) into the MP. On completion of a PCI burst read cycle, the contents of the Pool Write Pointer gets incremented on the long-word boundary.

SCRATCH
Address value is 0x8, provided as a constant C_SCRATCH in the *pidef* package. This is a 32-bit read/write register, but currently used only as a read-only register. On the completion of a compare command on the PCI cycle, this register contains the offset of the first mismatch in that burst cycle, in case of a miscompare. If there is no miscompare, the value of this register is not valid.

ERRSTAT
Address value is 0xC, provided as a constant C_ERRSTAT in the *pidef* package. This is a 16-bit read/write register. This register provides status bits indicating the status of the error that occurred in the previous PCI cycle. The status of the bits is cleared immediately after start of a new PCI cycle. So the contents of the register are accessible only if read before another PCI cycle is started.

Status bits in the ERRSTAT register :

| | |
|---|---|
| Bit 1 | Indicates a CP/BM timeout. Whenever a PCI transaction is started, and there is no activity (like, no transfers, etc.), then the CP/BM times out on the value of CPBM_TO register. The timeout sets this bit to '1'. |
| Bit 2 | Indicates that a command which is not implemented is given on the CMD bus. This could also be a code that is not valid. Whenever such a command is given, the CP/BM returns a DONE signal, and also a ERROR signal, setting this bit in the ERRSTAT register. |
| Bit 3 | In case of any compare commands - like COMPARE_ONCE, CMP_LOOP_WHILE_EQL, CMP_LOOP_WHILE_NEQ, WRITE_VERIFY, etc. a mismatch sets this bit indicating that an error has occurred. |
| Bit 4 | In case of loop compares, the CP/BM would loop until it times out on the value of register CMP_LOOPCT, or it gets a pass on the compare function. When a timeout occurs, this bit is set to indicate the error. |
| CPBM_TO | Address value is 0x14, provided as a constant C_CPBM_TO in the *pidef* package. This is a 10-bit read/write register. It is set by default to a value of 100 (decimal). This is the count of number of clocks the PCI bus can be idle without any activity after a transaction is started. The value can be programmed to any different value for appropriate timeout. Upon a timeout, the error flag is set and the ERRSTAT register is appropriately updated. |
| CMP_LOOPCT | Address value is 0x18, provided as a constant C_CMP_LOOPCT in the *pidef* package. This is a 16-bit read/write register. It is set by default to 0. The value of this register indicates the number of iterations that a compare loop command needs to execute before it times out. The value needs to be programmed before a compare loop command is issued. Once programmed it does not change until it is programmed again. |
| CMP_WAITCT | Address value is 0x1C, provided as a constant C_CMP_WAITCT in the *pidef* package. This is a 10-bit read/write register. It is set by default to 0. The value of this register indicates the number of PCI clocks to wait between iterations in a loop compare command, preventing the CP/BM from dominating the PCI bus. |

AD_STEPCT- Address value is 0x20, provided as a constant C_AD_STEPCT in the *pidef* package. This is a 4-bit read/write register. It is set by default to 0. The value of this register indicates the number of PCI clocks that the address needs to be stepped, i.e., the address is held on the bus for so many clocks before the data phase is started.

Command Codes

The command codes for the CP/BM are given through the CMD bus provided in the interface for the CP/BM. There are a number of PI procedures which provide the user with simple ways of setting the commands. However, for more flexibility the user can create his/her own procedures to manipulate the CP/BM. The various fields of the CP/BM interface are explained in the Programming Interface portion of the documentation. Here a more intricate part of assignment of command codes is described.

The CMD bus is 5-bit wide. The lower 4-bits are used as regular PCI command codes with the MSB set to '0'. When the MSB is set to '1', then the command takes a different meaning.

For all the regular PCI read/write cycles, if the MSB is set to '1' it indicates that PCI cycle with a Dual Address Cycle, where a 64-bit address is given for the PCI bus cycle. The 64-bit address is given by driving the lower 32-bits on the PCI_ADDR bus and the upper 32-bits on the PCI_ADHI bus.

When the MSB is set to '1', and the lower 4-bits have their value set to the following PCI command, then the meaning is as shown below:

RESERVED4   PCI cycle to do a read on the local register of the CP/BM.
RESERVED5   PCI cycle to do a write on the local register of the CP/BM.
RESERVED8   PCI cycle to idle the CP/BM for certain number of clocks - this is used to allow the system to continue cycling without any bus transactions being initiated by the CP/BM.

PCI Bussim: *Programming Interface*

Introduction

This document describes the procedures available to user through the Programming Interface (PI) for programming the PCI Bussim model. The procedures provide a quick way of setting parameters for certain functions to be performed by the model with fewer parameters being passed.

The procedures are all divided into three major categories depending on which portion of the model, the procedure is programming. The three categories are :

The Master Memory Pool Interface,
    The Slave Memory Pool Interface, and
    The Command Processor/Bus Master Interface.

Interface to each of these categories is provided through signals of type PI2MP_REC, PI2SP_REC and PI2CP_REC respectively. These are signals of type *record*, with component fields relevant to provide the necessary parameters to the model.

The three record types are described below:

*PI to Memory Pool Interface record type*

The Master model (CP/BM) and the Slave model have the Memory Pool portions called the Master Pool (MP) and the Slave Pool (SP) respectively. These hold the parameters for a PCI transaction that the master initiates or the parameters for the PCI transaction to which the slave responds. (Usually, the parameters are for a burst mode cycle). The data in the MP is organized as three different fields - *data, byte_enables, wait_states*. The *data* is 32-bit, the *byte_enable* is 4-bit, and the *wait_state* is 8-bit. Each of these is available for reading or writing, specified by the respective *rw_n* (read/write) signals. The SP is similar to the MP, in organization, except that the number of fields are only two, which are - *data*, and *wait states*. This is because the slave does not drive the BE signal on the bus. Any operation to the MP or the SP is done through a *go - done* handshake mechanism. The operation is initiated by an event on the *pool_go* signal, and the pool memory signals the completion of the operation with an event on the *pool_done* signal.

As mentioned above, the interface to the Pool Memory is done through signals which interconnect the ports of the Pool Memory and are of *record* type. These signals are used by VHDL procedures which form the PI to provide the user with a lot of flexibility to pass parameters to program the Memory.

The *record* types of the signals used for the interface are described below.

Master Pool Interface signals

```
type PI2MP_REC is
    record
        pool_addr        : std_logic_vector(19 downto 0);
        pool_data_di     : std_logic_vector(31 downto 0);
        pool_data_do     : std_logic_vector(31 downto 0);
        pool_data_rw_n   : std_logic;
        pool_ws_di       : std_logic_vector(7 downto 0);
        pool_ws_do       : std_logic_vector(7 downto 0);
        pool_ws_rw_n     : std_logic;
        pool_be_di       : std_logic_vector(3 downto 0);
        pool_be_do       : std_logic_vector(3 downto 0);
        pool_be_rw_n     : std_logic;
        pool_go          : std_logic;
        pool_done        : std_logic;
    end record;
```

PI2MP_REC fields

| | |
|---|---|
| *pool_addr* | Provides the address for the *data, be, ws* in the Memory Pool. |
| *pool_data_di* | Specifies the *data* input for a data write operation. |
| *pool_data_do* | Gives the *data* output for a data read operation. |
| *pool_data_rw_n* | Specifies a read ('1') or write ('0') operation of *data*. |
| *pool_ws_di* | Specifies the *wait_state* input for a write operation. |
| *pool_ws_do* | Gives the *wait_state* output for a read operation. |
| *pool_ws_rw_n* | Specifies a read ('1') or write ('0') operation of *wait_state*. |
| *pool_be_di* | Specifies the *byte_enable* input for a write operation. |
| *pool_be_do* | Gives the *byte_enable* output for a read operation. |
| *pool_be_rw_n* | Specifies a read ('1') or write ('0') operation of *byte_enable*. |
| *pool_go* | Triggers an operation on the Memory Pool. |
| *pool_done* | Signifies that the Memory Pool has completed the operation. |

Slave Pool Interface signals

```
type PI2SP_REC is
    record
```

```
            pool_addr           :   std_logic_vector(19 downto 0);
            pool_data_di        :   std_logic_vector(31 downto 0);
            pool_data_do        :   std_logic_vector(31 downto 0);
            pool_data_rw_n      :   std_logic;
            pool_ws_di          :   std_logic_vector(7 downto 0);
            pool_ws_do          :   std_logic_vector(7 downto 0);
            pool_ws_rw_n        :   std_logic;
            pool_go             :   std_logic;
            pool_done           :   std_logic;
    end record;
```

PI2SP_REC fields

| | |
|---|---|
| *pool_addr* | Provides the address for the *data, be, ws* in the Memory Pool. |
| *pool_data_di* | Specifies the *data* input for a data write operation. |
| *pool_data_do* | Gives the *data* output for a data read operation. |
| *pool_data_rw_n* | Specifies a read ('1') or write ('0') operation of *data*. |
| *pool_ws_di* | Specifies the *wait_state* input for a write operation. |
| *pool_ws_do* | Gives the *wait_state* output for a read operation. |
| *pool_ws_rw_n* | Specifies a read ('1') or write ('0') operation of *wait_state*. |
| *pool_go* | Triggers an operation on the Memory Pool. |
| *pool_done* | Signifies that the Memory Pool has completed the operation. |

*PI to CP/BM Interface record type*

The CP/BM is the PCI Bus Master model whose operation and parameters to those operations are controlled through the interface to the PI. The interface is through another signal of record type whose structure is described below. The parameters for any PCI Bus operation are specified through this signal.

```
type PI2CP_REC is
    record
            cmd             :   std_logic_vector(C_CMD_WD-1 downto 0);
            pci_addr        :   std_logic_vector(C_CP_AD_WD-1 downto 0);
            w_dataX         :   std_logic_vector(C_DT_WD-1 downto 0);
            w_dataY         :   std_logic_vector(C_DT_WD-1 downto 0);
            r_data          :   std_logic_vector(C_DT_WD-1 downto 0);
            burst_length    :   std_logic_vector(C_BL_WD-1 downto 0);
            rmw             :   std_logic;
            read_cmp        :   std_logic_vector(2 downto 0);
            bem_en          :   std_logic;
            wsm_en          :   std_logic;
            lock_req        :   std_logic;
            hold_req        :   std_logic;
            cycle_type      :   std_logic_vector(1 downto 0);
            gbl_wait_st     :   std_logic_vector(C_WS_WD-1 downto 0);
            slv_wait_st     :   std_logic_vector(C_WS_WD-1 downto 0);
            error           :   std_logic;
            cmd_clk_dis     :   std_logic;
            cpbm_go         :   std_logic;
            cpbm_done       :   std_logic;
```

```
              reset_n       : std_logic;
end record;
```

PI2CP_REC fields

| | |
|---|---|
| *cmd* | Type of PCI cycle to be issued by the CP/BM. |
| *pci_addr* | Address of the PCI cycle. |
| *w_dataX* | Write data for single transfer, Compare data for read, AND mask for RMW. |
| *w_dataY* | OR mask for Read/Modify/Write (RMW), and mask for all compares. |
| *r_data* | Data read from a read cycle on PCI Bus. |
| *burst_length* | Number of transfers in a burst cycle. |
| *rmw* | Flag enabling ('1') or disabling ('0') Read/Modify/Write on a bus-cycle. |
| *read_cmp* | Flag enabling ('1') or disabling ('0') Read Compare on a bus-cycle. |
| *bem_en* | Flag enabling ('1') byte enables to be taken from Pool Memory. |
| *wsm_en* | Flag enabling ('1') wait states to be taken from Pool Memory. |
| *lock_req* | Flag enabling ('1') or disabling ('0') a lock operation on a bus-cycle. |
| *hold_req* | Flag to hold ('1') or release ('0') the REQ_N after getting a GNT_N. |
| *cycle_type* | Gives the type of cyle 8-bit, 16-bit or 32-bit. |
| *gbl_wait_st* | Master wait states as number of clocks, when *wsm_en* is disabled. |
| *slv_wait_st* | Global value for Slave wait states. |
| *error* | Indicates an error in the operation of the PCI bus cycle. |
| *cmd_clk_dis* | Enables ('0') or disables ('1') the CP/BM clock. |
| *cpbm_go* | Triggers the PCI bus cycle command on the CP/BM. |
| *cpbm_done* | Signals the completion of the CP/BM command specified. |
| *reset_n* | Resets the whole system. |

Interface Procedures

As mentioned above, the interface to the PI is through record type signals. The signal fields are used to interconnect the ports of the underlying components which is the CP/BM, the Slave Pool Memory, the Master Pool Memory, the Slave PCI model, and the Arbiter. The Slave PCI model or the CP/BM can be replaced with the user's test device and tested using the PI's procedures. Every procedure of the PI has its first two parameters as the signal providing the interface, and the type of operation the procedure needs to perform respectively.

Every procedure which creates an event on the *go* signal and triggers the transaction, *should* wait for the completion of the transaction indicated by an event on the *done* signal.

*Master Pool Memory Interface procedures*

*mpSetSignal( pi2mp_signal, operation, param );*

*This procedure sets up signal values on the Master Pool Memory Interface to perform a particular operation as specified by the* operation *parameter. However, this procedure does not initiate the operation, since the* pool_go *is not toggled.* pi2mp_signal    :    The Master Pool Memory interface signal to be set.

| operation | : | Specifies the operation to be performed. |
| param | : | Gives the argument for the operation specified. |

Valid operations are:

| SET_DATA | Sets the input data value to the Master Pool Memory. |
| SET_WS | Sets the input wait state value to the Master Pool Memory. |
| SET_BE | Sets the input byte enable value to the Master Pool Memory. |

The value is specified by the *param* as an integer or std_logic_vector.

*mpCycle( pi2mp_signal, operation, param1 [, param2][, param3] );*

| pi2mp_signal | : | The signal to interface the Master Pool Memory. |
| operation | : | Specifies the operation to be performed. |
| param1, param2 & param3 | : | Arguments for the operation specified. Can be specified as an *integer* or a *std_logic_vector*. |

*This procedure sets up the signal values as required by the operation specified, and the parameters passed. The parameters param1, param2 and param3 are dependent on the type of operation, and in some cases, param2 and param3 are optional. In addition it also triggers the execution of the operation by toggling the value on the pool_go signal. The end of execution of the operation will be indicated by the pool_done signal.*

Valid operations are:

| READ_ALL | Master Pool Memory read for data, wait states and bytes enables. |
| WRITE_ALL | Master Pool Memory write for all the three fields after they are setup using the *mpSetSignal()* procedures. |
| READ_DATA | Do a Master Pool Memory read for data alone. |
| READ_WS | Master Pool Memory read of wait states alone. |
| READ_BE | Master Pool Memory read of byte enables alone. |
| READ_DT_WS | Do a Master Pool Memory read for data and wait state only. |
| READ_DT_BE | Master Pool Memory read of data and byte enable only. |
| READ_WS_BE | Master Pool Memory read of wait state and byte enables only. |
| WRITE_DATA | Write the data value to the Master Pool Memory. |
| WRITE_WS | Write the wait state value to the Master Pool Memory. |
| WRITE_BE | Write the byte enable value to the Master Pool Memory. |
| WRITE_DT_WS | Write data and wait state to the Master Pool Memory. |
| WRITE_DT_BE | Write data and byte enable to the Master Pool Memory. |
| WRITE_WS_BE | Write wait state and byte enables to the Master Pool Memory. |

Of the above mentioned 11 operations, the first 8 operations require only *param1* to be specified, which is the address of the location to which the operation is done. The next 3 operations require *param2* in addition to *param1* which will be the component to be written into the Master Pool Memory address. For the last 3 operations, all three parameters - *param1*, *param2*, *param3* are required, where *param1* specifies the address of the Master Pool Memory and *param2* and

*param3* specify the two fields that are being written into the Pool. This procedure sets up the required signal values and also triggers the operation by toggling the *pool_go* signal.

*Slave Pool Memory Interface procedures*

*spSetSignal( pi2sp_signal, operation, param );*

This procedure sets up signal values on the Slave Pool Memory Interface to perform a particular operation as specified by the operation *parameter. However, this procedure does not initiate the operation, since the* pool_go *is not toggled.*

| | | |
|---|---|---|
| pi2sp_signal | : | The Slave Pool Memory interface signal to be set. |
| operation | : | Specifies the operation to be performed. |
| param | : | Gives the argument for the operation specified. |

Valid operations are:

| | |
|---|---|
| SET_DATA | Sets the input data value to the Slave Pool Memory. |
| SET_WS | Sets the input wait state value to the Slave Pool Memory. |

The value is specified by the *param* as an integer or std_logic_vector.

*spCycle( pi2sp_signal, operation, param1 [, param2] [, param3]);*

| | | |
|---|---|---|
| pi2sp_signal | : | The signal to interface the Slave Pool Memory. |
| operation | : | Specifies the operation to be performed. |
| param1, param2 | : | Arguments for the operation specified. |
| & param3 | | Can be specified as an *integer* or a *std_logic_vector*. |

This procedure sets up the signal values as required by the operation specified, and the parameters passed. The parameters param1, param2 and param3 are dependent on the type of operation, and in some cases, param2 and param3 are optional. In addition it also triggers the execution of the operation by toggling the value on the pool_go signal. The end of execution of the operation will be indicated by the pool_done signal.

Valid operations are:

| | |
|---|---|
| READ_ALL | Slave Pool Memory read for data and wait states. |
| WRITE_ALL | Slave Pool Memory write for both data and wait states after they are setup using the *spSetSignal()* procedure. |

| | |
|---|---|
| READ_DATA | Do a Slave Pool Memory read for data alone. |
| READ_WS | Slave Pool Memory read of wait states alone. |
| READ_DT_WS | Do a Slave Pool Memory read for both data and wait state. |
| WRITE_DATA | Write the data value to the Slave Pool Memory. |
| WRITE_WS | Write the wait state value to the Slave Pool Memory. |
| WRITE_DT_WS | Write both data and wait state to the Slave Pool Memory. |

Of the above mentioned 8 operations, the first 5 operations require only *param1* to be specified, which is the address of the location to which the operation is done. The next 2 operations require *param2* in addition to *param1* which will be the component to be written into the Slave Pool Memory address. The last operation requires both *param2* and *param3* in addition to *param1*. These two parameters specify the two fields that will be written to the Slave Pool Memory. This procedure sets up the required signal values and also triggers the operation by toggling the *pool_go* signal.

*CP/BM Interface procedures*

*cpSetGlobal( pi2cp_signal, operation, param );*

| | | |
|---|---|---|
| pi2cp_signal | : | The CP/BM interface signal to be set. |
| operation | : | Specifies the operation to be performed. |
| param | : | Gives the argument for the operation specified. |

*This procedure sets up the signal values on the interface signal to the CP/BM. The signal whose value is set up is specified by the operation parameter. param is dependent on the type of operation specified. This procedure does not start any transaction. In case of PCI_RESET the signal takes effect immediately and a reset of the system occurs.*

Valid operations are:

| | |
|---|---|
| PCI_RESET | Resets the CP/BM and issues a RESET on the PCIBUS. *param* is the duration of the RESET pulse in *nanoseconds*. It is of type *time*. |
| SET_CMD | Sets the command for the CP/BM. *param* would then be one of the commands recognized by the CP/BM. Valid commands are given below, which are 5-bit constants of std_logic_vector type : |

| | |
|---|---|
| C_IOR | I/O Read. |
| C_IOW | I/O Write. |
| C_MR | Memory Read. |
| C_MW | Memory Write. |
| C_CFGR | Configuration Read. |
| C_CFGW | Configuration Write. |
| C_MRM | Memory Read Multiple. |
| C_MRL | Memory Read Line. |

| | |
|---|---|
| C_MWI | Memory Write Invalidate. |
| C_DIOR | Dual Address I/O Read cycle. |
| C_DIOW | Dual Address I/O Write cycle. |
| C_DMR | Dual Address Memory Read cycle. |
| C_DMW | Dual Address Memory Write cycle. |
| C_DCFGR | Dual Address Configuration Read cycle. |
| C_DCFGW | Dual Address Configuration Write cycle. |
| C_IDLE | Idle the PCI-Bus of any activity. |
| C_LOC_WRITE | Write to local registers of the CP/BM. |
| C_LOC_READ | Read from local registers of the CP/BM. |

| | |
|---|---|
| SET_PCI_ADDR | The address for the PCI cycle is given using this operation. The *param* that follows is the value that is set on the 32-bit address bus. This can also be the value to be written into the local registers of the CP/BM, when the value referrers to an address. For example, writing to MP Write or Read Pointer. |
| SET_BURST_LEN | This operation allows setting the burst length for the PCI cycle that is being initiated. The burst length is an 8-bit value, and can be specified by *param* given as an integer in the range of 0-255, or a binary equivalent. |
| SET_CYCLE_TYPE | All the PCI cycles can be of 8-bit, 16-bit, or 32-bit type. The actual type is specified through *param*, as an integer (valid values being 8, 16 or 32 only) or as 3-bit *std_logic_vector* constants C_8BIT, C_16BIT, or C_32BIT. |
| SET_GBL_WAIT_ST | Set the global initiator wait states for the PCI cycle. This is an 8-bit *std_logic_vector* type, and so an integer value of 0-255 or its binary equivalent can be given. |
| SET_SLV_WAIT_ST | Set the global slave wait states for the PCI cycle. This is an 8-bit *std_logic_vector* type, and so an integer value of 0-255 or its binary equivalent can be given. |
| SET_READ_CMP | This sets up the signal value for the type of read compare operation. Valid values are: |

| | |
|---|---|
| C_NO_COMPARE | Disable compare function. |
| C_COMPARE_ONCE | Compare against expected value once. |
| C_LOOP_WHILE_EQL | Repeat cycle until read value is equal to expected value. |
| C_LOOP_WHILE_NEQ | Repeat cycle until read value is not equal to expected value. |
| C_WRITE_VERIFY | Start a Write cycle and read back the same location to verify the success of Write cycle. |

| | |
|---|---|
| SET_CMP_MASK | This operation sets the *w_dataY* signal, which is the mask for all the compare operations (except NO_COMPARE). If a bit is set to '1', it enables the compare of that bit in the data read. |
| SET_LOCK_REQ | Sets the *lock request* flag, to enable ('1') or disable ('0') the locking of a PCI cycle. *param* specifies the flag value to be set. It could be integer or boolean. |
| SET_HOLD_REQ | Sets the *hold request* flag to hold ('1') or release ('0') the *req_n* line after grant is issued by the arbiter. *param* specifies the flag value to be set either as an integer or a boolean value. |
| SET_WSM_EN | Sets the *wsm_en* signal value to use the global wait state ('0') or use the wait state from the Master Pool Memory. *param* specifies the value of the flag to be set as an integer or as a boolean value. |
| SET_SLV_WSM_EN | Sets the *slv_wsm_en* signal value to use the global slave wait state ('0') or use the slave wait state from the Slave Pool Memory. *param* specifies the value of the flag to be set as an integer or as a boolean value. |
| SET_BEM_EN | Sets the *bem_en* signal value to enable the default byte enables generation ('0') or use the byte enables from the Pool Memory ('1'). The flag is set by specifying the value as an integer or as a boolean. |
| SET_RMW | Enables ('1') or disables ('0') the Read/Modify/Write function. *param* sets the value of the flag and its value is specified as an integer or as a boolean value. |
| CMD_CLK_DIS | Enables ('1') or disables ('0') the PCI-Bus clock. The value to be set is specified by *param* as an integer or as a boolean value. |

*cpPciCycle( pi2mp_signal, operation, param1 [, param2] [, param3] );*

| | | |
|---|---|---|
| pi2cp_signal | : | The CP/BM interface signal to be set. |
| operation | : | Specifies the operation to be performed. |
| param1, param2, param3 | : | Arguments for the operation specified. |

*This procedure sets up signal values to start a transaction. Of the three parameters the last two are optional depending on the type of operation specified. Also, their values depend on the type of operation. This procedure triggers the transaction by toggling the value on the interface signal cpbm_go. The completion of the transaction is indicated by an event on the interface signal cpbm_done.*

Valid operations are:

| | |
|---|---|
| PCI_IDLE | Keeps the CP/BM idle for the number of clocks specified by the *param1*. The bus activity is stopped until the number of clocks have elapsed from the start of this command. |

| | | |
|---|---|---|
| PCI_LOC_READ | | Sets up the command to do a read operation on the local registers of the CP/BM. *param1* specifies the addresss of the local register. The Read compare and Read / Modify / Write functions of the CP/BM are invalidated with this operation. They need to be validated when needed. Valid addresses are provided as integer constants: |
| | C_POOL_RP | Pool Read pointer used for reading data / wait states / byte enables from the Pool Memory while performing a PCI cycle. |
| | C_POOL_WP | Pool Write pointer used for writing the data read, during a PCI read cycle. |
| | C_SCRATCH | Scratch register, contains the return status values of certain commands. |
| | C_ERRSTAT | Error status register, used for maintaining the error status. |
| | C_CMP_LOOPCT | Register contains the count for the maximum number of iterations in case of a loop compare cycle. |
| | C_CMP_WAITCT | Register contains the count of the number of clocks to wait in between the each iteration of a loop compare cycle. |
| PCI_LOC_WRITE | | Sets up the command to do a write on one of the registers mentioned in the above read command. The register is mentioned through the *param1*. This operation invalidates the Read compare and Read/Modify/Write operation and needs to be validated just before using it. |
| PCI_MR | | PCI Memory Read cycle is issued by the CP/BM. The address for the PCI cycle is given by *param1*. For either the single transfer case or the burst transfer case, no extra parameters are required. The Read compare and Read / Modify / Write operations of the CP/BM are invalidated until validated by setting the respective signals. |
| PCI_MW | | PCI Memory Write cycle is issued by the CP/BM on the PCI bus. The address for the cycle is given by *param1*. In case of burst cycle (burst length > 1), no additional parameters are required. For a single transfer cycle, *param2* specifies the data to be written. This value is set on the *wdata_X* of the interface signal. If the burst length is set to 1, and *param2* is not specified, then the old value on *wdata_X* is used as the data to be written. Read compare and Read/Modify/Write operations are invalidated until valid values are set on them again. |
| PCI_IOR | | Same as PCI_MR, but the cycle issued is a I/O read cycle. |

| | |
|---|---|
| PCI_IOW | Same as PCI_MW, but the cycle issued is a I/O write cycle. |
| PCI_CFGR | Same as PCI_MR, but the cycle issued is a configuration read cycle. |
| PCI_CFGW | Same as PCI_MW, but the cycle issued is a configuration write cycle. |
| PCI_MRV | Same as PCI_MR, but the Read compare value is not modified. This is because, the required type of compare should be specified immediately before calling this procedure for a Read compare by the *cpSetGlobal* procedure. The mask used for comparison is set with the *cpSetGlobal* procedure using the SET_CMP_MASK operation. The Read / Modify / Write option is disabled. |
| PCI_IORV | Same as PCI_MRV, but comparison is done on a I/O read cycle. |
| PCI_CFGRV | Same as PCI_MRV, but comparison is done on a configuration read cycle. |
| PCI_MRMW | Same as PCI_MR, but the Read comparison is set to *NO_COMPARE* state and the Read / Modify / Write signal is enabled. The Memory Read operation is done at the address specified by *param1*, and the *param2* and *param3* specify the AND, and OR masks for the RMW operation. |
| PCI_IORMW | Same as PCI_MRMW, but the Read/Modify/Write is done on a I/O read cycle. |
| PCI_CFGRMW | Same as PCI_MRMW, but the Read/Modify/Write is done on a configuration read cycle. |

What is claimed is:

1. A software model for use with a computer bus device test simulator for testing a user device, comprising:
   a command processor for processing a series of commands;
   a first memory portion for receiving information relating to the commands;
   a programming interface for providing the commands to the command processor and the information to the first memory portion; and
   a second memory portion for receiving data from said programming interface and from the user device: wherein
   said first memory portion includes a plurality of access ports: and
   the plurality of access ports includes a read/write port linking said programming interface and said first memory portion, a read port linking said command processor to said first memory portion, and a write port linking said command processor to said first memory portion.

2. The model of claim 1, wherein:

information provided to said first memory portion consists of data to be used by the command, a byte enable, and a wait state.

3. The model of claim 1, wherein:

the series of commands includes a read-verify command.

4. The model of claim 1, wherein:

the series of commands includes a read-modify-write command.

5. The model of claim 1, wherein:

said first memory portion includes three access ports.

6. The model of claim 1, and further including:

an arbiter for controlling access of the user device to the second memory portion.

* * * * *